US011330730B2

(12) United States Patent
Tramet et al.

(10) Patent No.: US 11,330,730 B2
(45) Date of Patent: May 10, 2022

(54) ELECTRICAL INSULATION MODULE FOR HIGH VOLTAGE ELECTRICAL EQUIPMENT

(71) Applicant: Valeo Siemens eAutomotive France SAS, Cergy (FR)

(72) Inventors: Guillaume Tramet, Ecquevilly (FR); Pierre Smal, Sartrouville (FR); Mahi-Eddine Tsouria-Belaid, Paris (FR)

(73) Assignee: VALEO SIEMENS EAUTOMOTIVE FRANCE SAS, Cergy (FR)

( * ) Notice: Subject to any disclaimer, the term of this patent is extended or adjusted under 35 U.S.C. 154(b) by 0 days.

(21) Appl. No.: 17/116,452

(22) Filed: Dec. 9, 2020

(65) Prior Publication Data
US 2021/0185841 A1 Jun. 17, 2021

(30) Foreign Application Priority Data
Dec. 12, 2019 (FR) ...................................... 1914292

(51) Int. Cl.
*H05K 5/02* (2006.01)
*H05K 5/00* (2006.01)

(52) U.S. Cl.
CPC ......... *H05K 5/0247* (2013.01); *H05K 5/0004* (2013.01); *H05K 5/0213* (2013.01); *H05K 5/0217* (2013.01)

(58) Field of Classification Search
None
See application file for complete search history.

(56) References Cited

U.S. PATENT DOCUMENTS

| 3,803,457 | A | 4/1974 | Yamamoto |
| 6,927,533 | B1* | 8/2005 | Ito ......................... H01J 29/028 313/292 |

(Continued)

FOREIGN PATENT DOCUMENTS

| DE | 102010043445 B3 | 4/2012 |
| DE | 102016222823 A1 | 5/2018 |

(Continued)

OTHER PUBLICATIONS

French Search Report for Application No. 1914292 dated Jul. 27, 2020.

*Primary Examiner* — Xanthia C Cunningham
(74) *Attorney, Agent, or Firm* — McCormick, Paulding & Huber PLLC

(57) ABSTRACT

The invention relates to an electrical insulation module configured to determine at least one leakage path between an electrical component and a casing receiving said electrical component. The electrical insulation module, being made of electrically insulating material, comprises a spacer configured to define the at least one leakage path between said electrical component and said casing. Said spacer comprises a bottom wall and a peripheral wall, in which the peripheral wall follows a direction different from that of the bottom wall, an inner angle being formed between the bottom wall and the peripheral wall; and the at least one leakage path comprises at least one dimension of a surface corresponding to a portion of the bottom wall and/or a dimension of a surface of a portion of the peripheral wall.

20 Claims, 2 Drawing Sheets

(56) References Cited

U.S. PATENT DOCUMENTS

| | | | | |
|---|---|---|---|---|
| 10,490,469 | B2* | 11/2019 | Tani | H05K 7/1432 |
| 2007/0018176 | A1* | 1/2007 | Hirosawa | H01J 29/028 |
| | | | | 257/89 |
| 2007/0090741 | A1* | 4/2007 | Jung | H01J 29/028 |
| | | | | 313/292 |
| 2009/0072695 | A1* | 3/2009 | Hiroike | H01J 29/864 |
| | | | | 313/292 |
| 2011/0229508 | A1* | 9/2011 | McNeely | A61P 27/02 |
| | | | | 424/190.1 |
| 2014/0048958 | A1* | 2/2014 | Gatterbauer | H01L 24/05 |
| | | | | 257/782 |
| 2019/0088545 | A1* | 3/2019 | Okuda | H01L 21/76898 |
| 2021/0119310 | A1* | 4/2021 | Sasaki | H01M 50/284 |

FOREIGN PATENT DOCUMENTS

| | | | | |
|---|---|---|---|---|
| WO | 2015059552 | A1 | 4/2015 | |
| WO | WO-2019181508 | A1 * | 9/2019 | H01M 50/291 |

* cited by examiner

ELECTRICAL INSULATION MODULE FOR HIGH VOLTAGE ELECTRICAL EQUIPMENT

CROSS-REFERENCE TO RELATED APPLICATION

This application claims foreign priority benefits under 35 U.S.C. § 119 to French Patent Application No. 1914292 filed on Dec. 12, 2019, the content of which is hereby incorporated by reference in its entirety.

TECHNICAL FIELD

The present invention relates, generally speaking, to the field of electrical equipment.

The invention more specifically pertains to high voltage electrical equipment for electric or hybrid vehicles.

BACKGROUND

An electrical equipment of an electric or hybrid vehicle, such as an inverter of an electric vehicle, comprises electrical components housed in a casing of the electrical equipment, as illustrated in FIG. 1. FIG. 1 illustrates the longitudinal section of an electrical equipment 100 comprising a casing 112 and an electrical component 111. The casing 112, comprising a side wall 116 and a base plate 115, is generally made of metal. The electrical component 111 is for example, like the casing 112, an electrically conductive object. Alternatively, the electrical component 111 may comprise an insulating outer shell which is capable of having a defect. Such a defect potentially leads to a leakage current between the electrical component 111 and the casing 112.

To improve thermal dissipation and to insulate the electrical component 111 with the base plate 115, the electrical equipment generally comprises a thermal pad 66. The thermal pad 66 is placed between the base plate 115 of the casing 112 and the electrical component 111. The thermal pad 66 is made of an insulating material and has a thermal conductivity enabling dissipation of heat between the electrical component 111 and the base plate 115.

The difference in electrical potential between the casing 112 and the electrical component 111, in particular between the side wall 116 and the electrical component 111, determines an electrical safety distance 131, which it is necessary to respect in order to avoid the creation of a parasitic electrical pathway between the electrical component 111 and the casing 112 through air. For example, in the electrical equipment 100, the minimum distance between the electrical component 111 and the side wall 116 must be of a distance greater than this electrical safety distance 131, so as to ensure that, during the use of the electrical equipment 100, there is no possibility of breakdown of the electrical insulation through air.

Moreover, the difference in electrical potential between the casing 112 and the electrical component 111, in particular between the base wall 115 and the electrical component 111, determines a leakage path 170. The leakage path 170 is determined as the path of weakest resistance followed by a parasitic surface electric current between the electrical component 111 and the casing 112, in particular between the electrical component 111 and the base plate 115. In the present case, the leakage path 170 extends in particular along the outer surface of the thermal pad 66 between the electrical component 111 and the base plate 115. The leakage path 170 follows the contour of the thermal pad 66 before touching the base plate 115. The leakage path 170 must be sufficiently long so that a parasitic electric current between the electrical component 111 and the casing 112 does not appear.

However, if the electrical component 111 of the electrical equipment 100 of FIG. 1 is a high voltage (HV) electrical component, said difference in electrical potential is too great for the leakage path 170 to be sufficiently long to avoid the appearance of a surface leakage current. In this case, for the electrical equipment 100, it is very important to further lengthen the leakage path 170, while limiting the bulk in the electrical equipment 100.

To overcome at least one of the aforesaid drawbacks, the present invention targets an inexpensive solution which allows to increase the length of the leakage path without increasing the size of an electrical equipment.

SUMMARY

To arrive at this result, the present invention relates to an electrical insulation module configured to determine at least one leakage path between an electrical component and a casing receiving said electrical component. The electrical insulation module, being made of electrically insulating material, comprises a spacer configured to define the at least one leakage path between said electrical component and said casing. Said spacer comprises a bottom wall and a peripheral wall, in which the peripheral wall follows a direction different from that of the bottom wall, an inner angle being formed between the bottom wall and the peripheral wall; and the at least one leakage path comprises at least one dimension of a surface corresponding to a portion of the bottom wall and/or a dimension of a surface of a portion of the peripheral wall.

The invention allows thus to increase the length of the leakage path without increasing the size of an electrical equipment.

Advantageously, said inner angle is comprised between 80 and 110 degrees.

In an advantageous manner, said spacer comprises a reception cavity defined by the bottom wall and the peripheral wall is configured to receive at least one portion of the at least one electrical component. In particular, the bottom wall is configured to receive said electrical component against it, and the peripheral wall is configured to come at least in part around said electrical component.

In a preferential manner, the peripheral wall comprises a rim, the at least one leakage path further comprising a dimension of a surface of said rim. In particular, the peripheral wall is in contact with the bottom wall at the level of a first end of the peripheral wall and the peripheral wall comprises a second end opposite to the first end; said rim extending from the second end along a transversal direction with respect to the peripheral wall.

Preferentially, the electrical insulation module comprises a thermal pad configured to be positioned between said electrical component and said spacer, said thermal pad being configured to evacuate at least a part of the heat generated during the operation of the electrical component.

Advantageously, the spacer comprises an opening formed in the bottom wall and configured to enable contact between the thermal pad and a wall of the casing so as to evacuate at least a part of said generated heat.

In an advantageous manner, the thermal pad is made of a deformable material. In particular, the thermal pad is configured to deform when the electrical component is received in the reception cavity, in particular against the bottom wall.

The thermal pad being interposed between said electrical component and said bottom wall. The thermal pad deforms, in particular, in such a way as to traverse the opening of the bottom wall to come into contact with the wall of the casing.

The present invention also relates to an electrical equipment comprising a casing and at least one electrical component; said casing comprising at least one housing defined by a side wall and a support plate on which the at least one electrical component is mounted; the electrical equipment comprising an electrical insulation module such as briefly described above.

According to an alternative, the electrical component is received in said reception cavity of the electrical insulation module.

According to an alternative, a first leakage path extends successively along an upper outer surface of the thermal pad situated between the electrical component and the peripheral wall; and an inner surface of the peripheral wall devoid of thermal pad.

According to a particular alternative, the peripheral wall of the spacer is in contact with the side wall of the casing; and the first leakage path extends up to the side wall of the casing.

Alternatively, the peripheral wall of the spacer is at a distance from the side wall of the casing; and the first leakage path extends along an outer surface of the peripheral wall of the spacer up to said support plate.

According to an alternative, a first leakage path extends successively along an upper outer surface of the thermal pad situated between the electrical component and the peripheral wall; an inner surface of the peripheral wall devoid of thermal pad; and an outer surface of the peripheral wall up to said support plate.

According to an alternative, a second leakage path extends successively along an upper outer surface of the thermal pad situated between the electrical component and the peripheral wall; a first contact surface between the thermal pad and said peripheral wall; and a third contact surface between the thermal pad and said bottom wall up to said support plate.

In a preferential manner, the at least one electrical component is a capacitive element or a coil or a capacitance or a transformer.

Preferentially, said electrical equipment is an inverter or a DC-DC voltage converter or an electric charger, notably configured to be on board a vehicle.

Preferentially, the at least one electrical component is a high voltage electrical component.

Advantageously, said support plate is a base plate of said casing, or an intermediate plate installed between a base plate and an opening of said casing.

In an advantageous manner, said side wall is orthogonal to said support plate, said side wall being a peripheral wall of said casing or a partitioning wall installed in said casing.

BRIEF DESCRIPTION OF THE FIGURES

Other characteristics and advantages of the invention will become clearer on reading the description that follows. This is purely illustrative and should be read with regard to the appended drawings in which.

It should be noted that figures set out the invention in a detailed manner for implementing the invention, said figures obviously being able to serve to better define the invention if need be.

DETAILED DESCRIPTION

Figure 1:
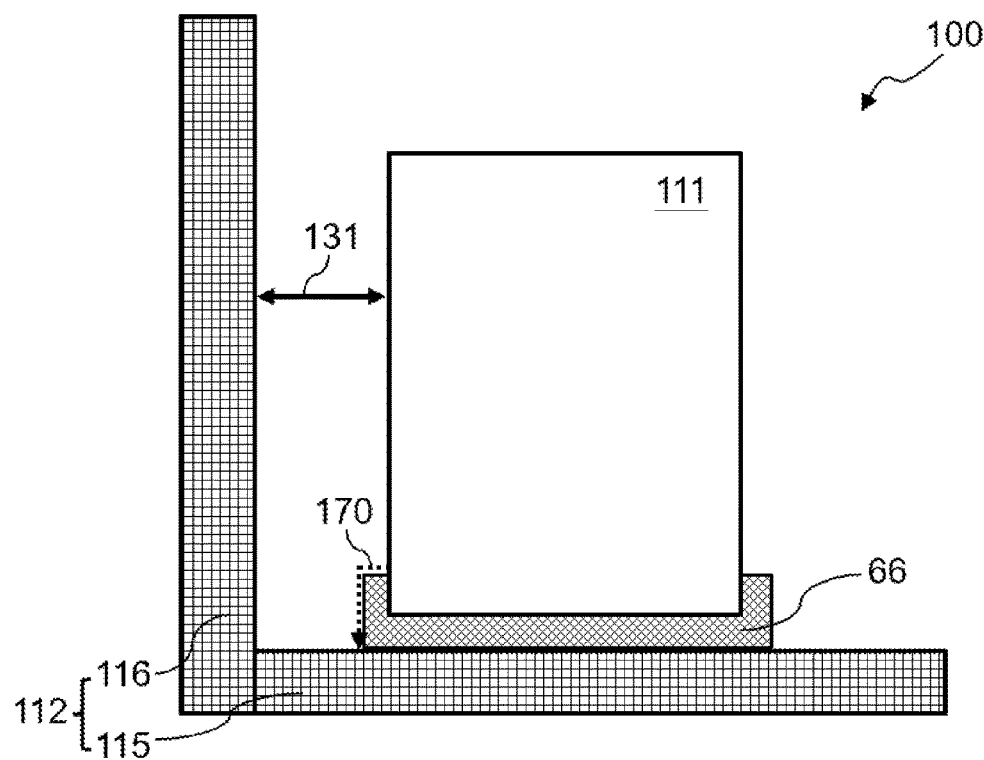
FIG. 1 illustrates the longitudinal section of a conventional electrical equipment comprising a thermal pad.
Figure 2:
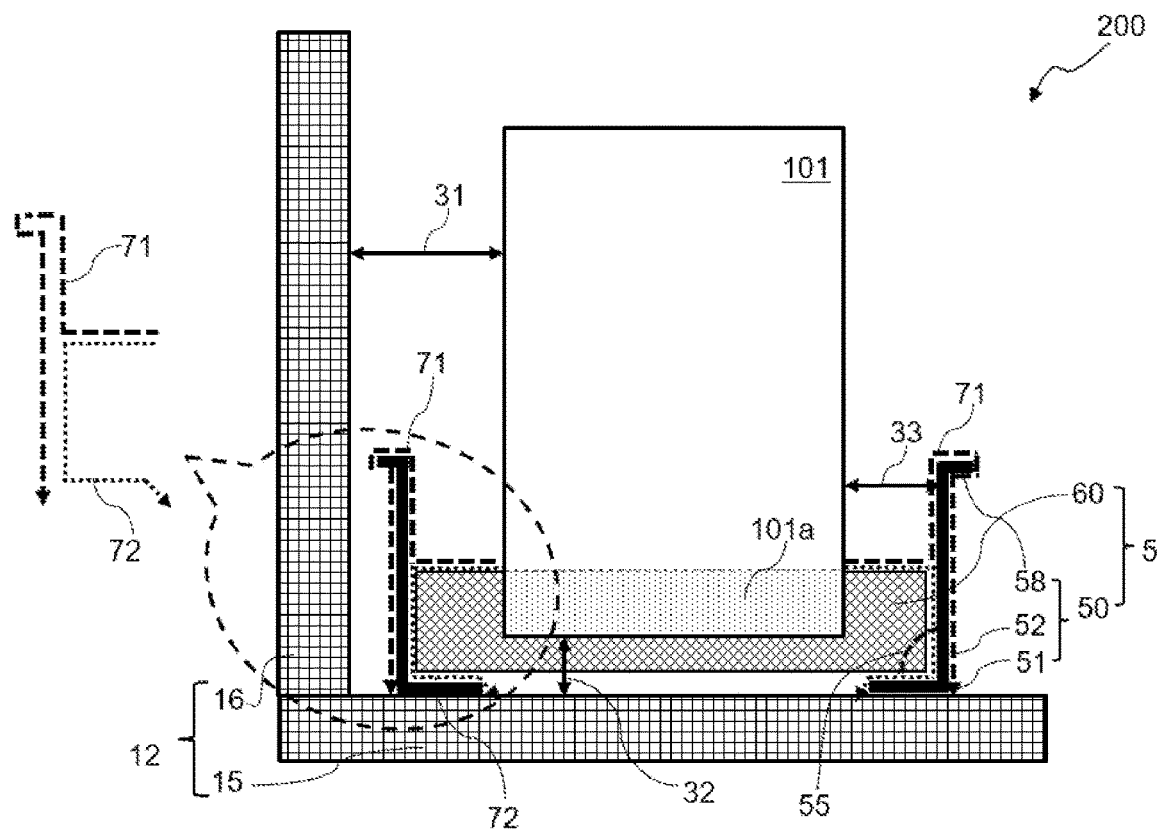
FIG. 2 illustrates the longitudinal section of an electrical insulation module installed in an electrical equipment, according to an embodiment of the invention.

FIG. 2 illustrates the longitudinal section of an electrical insulation module 5, installed in an electrical equipment 200, according to an embodiment of the invention. The electrical equipment 200 comprises a casing, at least one electrical component 101, and the electrical insulation module 5. To facilitate understanding, the example of the electrical equipment 200 illustrated in FIG. 2 comprises a single electrical component 101.

The electrical insulation module 5, being made of electrically insulating material, is configured to define at least one leakage path 71, 72 of the electrical equipment 200, the length of said at least one leakage path being increased compared to the prior art. The electrical insulation module 5 will be described in greater detail in the following paragraphs.

The casing comprises at least one housing configured to house the at least one electrical component 101. FIG. 2 describes such a housing 12. The housing 12 is defined by a side wall 16 and a support plate 15 on which the at least one electrical component 101 is mounted. In a preferential manner, the side wall 16 and the support plate 15 are respectively made of an electrically conductive material, such as a metal material. Advantageously, said conductive material is a metal or a metal alloy, selected for example from among the following materials: aluminium, copper, aluminium alloy, copper magnesium alloy.

In an embodiment, the casing of the electrical equipment 200 comprises a single housing. In this case, the support plate 15 is a base plate of said casing. The side wall 16 is a side wall of the casing. In an alternative embodiment, the casing comprises several housings. At least one of these housings of which the side wall 16 and/or the support plate 15 are respectively a partitioning wall and/or an intermediate plate installed inside the casing of the electrical equipment 200. Said partitioning wall is preferably parallel to the side wall of the casing. Said intermediate plate, installed between an upper opening of the casing and the base plate of the casing, is preferably parallel to the base plate of the casing.

According to an example, the thicknesses of the side wall 16 and the support plate 15 are respectively 4 mm (millimetres) and 4 mm. In addition, in the present embodiment, the casing and the housing have respectively a rectangular parallelepiped shape. In an alternative manner, the casing and the housing may have another shape, for example a cylinder.

The side wall 16 is preferably orthogonal to the support plate 15; that is to say an inner angle between the support plate 15 and the side wall 16 is equal to 90 degrees. In an alternative manner, said inner angle may be comprised between 80 and 110 degrees.

In an embodiment, the at least one electrical component 101 is configured to have an electrical potential. The electrical component 101 is for example a capacitive element, a coil, a capacitance, or a transformer. The electrical component 101 may be a high voltage electrical component. High voltage preferably designates a voltage greater than 60V (Volts), even greater than 80V, or even greater than 100V. The electrical equipment 200 may be an inverter, a DC-to-DC voltage converter or an electric charger, notably configured to be on board a vehicle. In an embodiment, the electrical component 101 comprises an insulating shell. The part of the electrical component 101 opposite a bottom wall 51 of a spacer 50 (described in greater detail hereafter) and in contact with a thermal pad 60 (described in greater detail hereafter) is devoid of insulating shell in order to favour thermal exchange. The part of the electrical component 101 opposite the bottom wall 51 comprises, in particular, a thermally conductive part, notably metallic.

In a preferential manner, a first spacing 31 exists between the side wall 16 of the housing 12 and the at least one electrical component 101. The first spacing 31 is advantageously comprised between 0 mm and 10 mm. The length of the first spacing 31 is greater than or equal to an electrical insulation distance through air.

Preferentially, there exists a second spacing 32 between the support plate 15 of the housing 12 and the at least one electrical component 101. The second spacing 32 is advantageously comprised between 0.5 mm and 5 mm. In a preferential embodiment where said thermal pad 60 is used, the second spacing 32 is largely filled by the thickness of the thermal pad 60.

Figure 3:
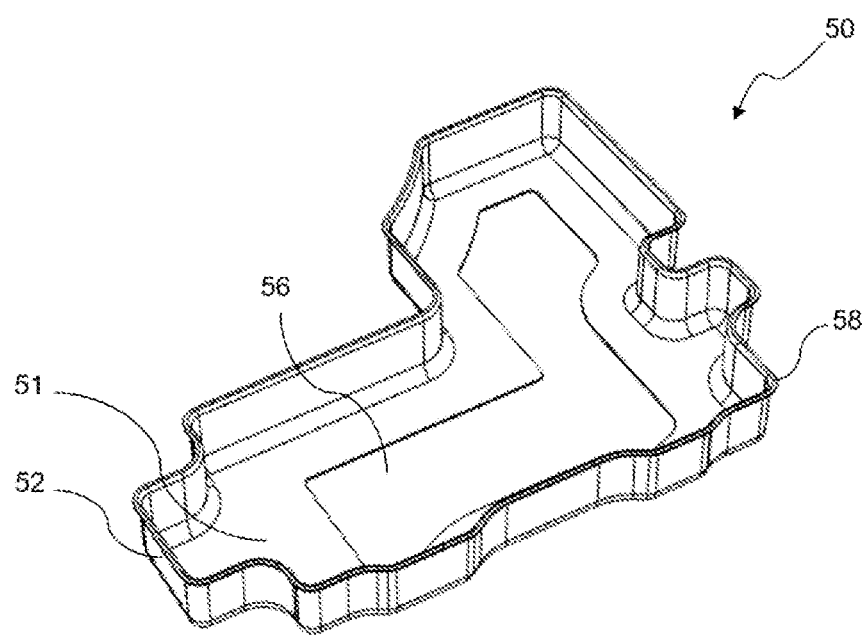
FIG. 3 illustrates a spacer of the electrical insulation module according to an embodiment of the invention.
Figure 4:
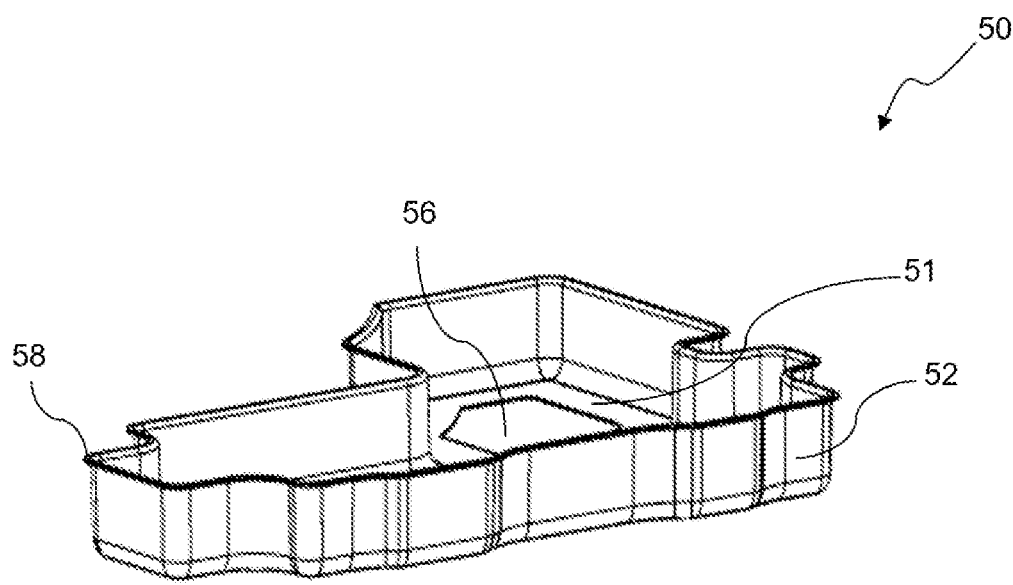
FIG. 4 illustrates the spacer according to a perspective different from that of FIG. 3.

The electrical insulation module 5 comprises said spacer 50. FIGS. 3 and 4 illustrate, according to two different perspectives, the spacer 50 according to an embodiment of the invention. The spacer 50 comprises said bottom wall 51, a peripheral wall 52 and a reception cavity. The peripheral wall 52, being preferably located between the at least one electrical component 101 and the side wall 16, follows a direction different from that of the first spacing 31. The bottom wall 51 and/or the peripheral wall 52 may be multi-thickness, that is to say have variable thicknesses. In an embodiment, an inner angle 55 formed between the bottom wall 51 and the peripheral wall 52 is comprised between 80 and 110 degrees. The peripheral wall 52 is preferably orthogonal to the bottom wall 51; that is to say said inner angle 55 being 90 degrees.

The peripheral wall 52 preferably comprises a rim 58, notably configured to make it possible to grab and handle the spacer 50. The rim 58 is formed at a second end of the peripheral wall 52 which is distal with respect to a first end of the peripheral wall 52 from which the bottom wall 51 extends. In a preferential manner, the spacer 50 is formed of a single piece. In addition, the spacer 50 may be manufactured by carrying out a stamping manufacturing method, and the rim 58 may thus be imposed by a stamping process. The rim 58 is thus counted in the first leakage path 71, which allows thus to reduce the height of the spacer 50, in particular the distance between the first end of the peripheral wall 52 and the second end of the peripheral wall 52.

Said reception cavity, defined by the bottom wall 51 and the peripheral wall 52, is configured to receive at least one portion 101a of the at least one electrical component 101, such as for example illustrated in FIG. 2. The spacer 50 is placed in the housing 12. More specifically, the spacer 50 is placed between the at least one electrical component 101 and the assembly of the support plate 15 and the side wall 16. In a preferential manner, a third spacing 33 exists between the peripheral wall 52 and the portion 101a of the at least one electrical component 101. The third spacing 33, is in particular less than the first spacing 31. The third spacing 33 is advantageously comprised between 0.5 mm and 10 mm.

The material of the spacer 50 is preferably made of plastic/insulating material. The thicknesses of the bottom wall 51 and the peripheral wall 52 are respectively preferably very thin, for example between 0.25 mm and 1.2 mm. Said reception cavity is preferably a cavity with a flat bottom. The height of the peripheral wall 52, notably the distance between the first end of the peripheral wall 52 and the second end of the peripheral wall 52, must be at least 10 mm. The shape and the volume of the reception cavity are determined as a function of the shape and the volume of the portion 101a of the at least one electrical component 101.

In a preferential embodiment illustrated in FIG. 2, the electrical insulation module 5 further comprises the thermal pad 60 placed between the at least one electrical component 101 and the spacer 50. The spacer 50 further comprises an opening 56 formed in the bottom wall 51 and configured to enable contact between the thermal pad 60 and a wall of the casing, in particular against the support plate 15, so as to evacuate at least a part of the generated heat. The thermal pad 60 is configured to absorb at least a part of the heat generated during the operation of the at least one electrical component 101, and to evacuate through the opening 56 at least a part of said generated heat.

The thermal pad 60 is preferably made of a deformable or even elastic material. In an advantageous manner, the material of the thermal pad 60 is a silicone or ceramic material. The thickness of the thermal pad 60 in the free state is preferably comprised between 0.5 mm and 10 mm. The thickness of the thermal pad 60 in the compressed state is preferably comprised between 0.25 mm and 5 mm. In its compressed state, the thermal pad 60 fills the second spacing 32 (as mentioned previously) to come against the support plate 15.

The at least one leakage path, for example the leakage paths 71 and 72, is determined as a function of a surface corresponding to a portion of the bottom wall 51, and/or at least one portion of the peripheral wall 52. Said surface corresponding to a portion of the bottom wall 51 may be a surface of the bottom wall 51 itself, or another surface which does not belong to, but is parallel to, the bottom wall 51, for example an upper outer surface of the thermal pad 60 situated between the electrical component 101 and the peripheral wall 52.

More specifically, the at least one leakage path is determined as a function of at least one of the following surfaces defined by the presence of the electrical insulation module 5, because a potential leakage current would be forced to travel along these surfaces: an upper outer surface of the thermal pad 60 situated between the electrical component 101 and the peripheral wall 52; a first contact surface between the thermal pad 60 and said peripheral wall 52; a third contact surface between the thermal pad 60 and said bottom wall 51; a surface of the peripheral wall 52 forming an inner surface (that is to say turned towards the reception cavity) of the peripheral wall 52 devoid of thermal pad 60, that is to say an inner surface of the peripheral wall 52 situated between the thermal pad 60 and the second end of the peripheral wall 52; an outer surface (that is to say opposite to the inner cavity) of the peripheral wall 52 which extends in particular between said second end and the support plate 15; if appropriate, a surface of the rim 58. The more the available surfaces are used, the longer the length of the leakage path.

As illustrated for example in FIG. 2, a first leakage path 71 is determined as a function of all of the following surfaces: the upper outer surface of the thermal pad 60 situated between the electrical component 101 and the peripheral wall 52; the inner surface of the peripheral wall 52 devoid of thermal pad 60; and the outer surface of the peripheral wall 52 which extends in particular between said second end and the support plate 15. The first leakage path 71 thus comprises a dimension corresponding to the course of the upper outer surface of the thermal pad 60, a dimension corresponding to the course of the inner surface of the peripheral wall 52 devoid of thermal pad 60, and a dimension corresponding to the course of the outer surface of the peripheral wall 52 which extends in particular between said second end and the support plate 15. If the peripheral wall 52 comprises a rim 58, the first leakage path 71 is further determined as a function of the surface of said rim 58. Hence, the first leakage path 71 also comprises a dimension corresponding to the course of the surface of the rim 58. Alternatively, the peripheral wall 52 of the spacer 50 may be in contact with the side wall 16 of the casing. The first leakage path 71 then extends up to the side wall 16 of the casing, and stops in particular at the level of the end of the peripheral wall 52 which is in contact with the side wall 16 of the casing.

Furthermore, a second leakage path 72 is determined as a function of all of the following surfaces: the upper outer surface of the thermal pad 60 situated between the electrical component 101 and the peripheral wall 52; said first contact surface between the thermal pad 60 and said peripheral wall 52; and said third contact surface between the thermal pad 60 and said bottom wall 51. The second leakage path 72 thus comprises a dimension corresponding to the course of the upper outer surface of the thermal pad 60, a dimension corresponding to the course of the second contact surface and a dimension corresponding to the course of the third contact surface.

Compared to the leakage path illustrated in the prior art, the invention allows to greatly lengthen the leakage paths 71, 72 using said surfaces defined by the presence of the electrical insulation module 5. In addition, the spacer 50 is very light and easy to mount on the electrical equipment 200, which thus does not complicate the manufacture of the electrical equipment 200.

The invention thus proposes an easy to implement and inexpensive solution which, on the one hand, increases the length of the leakage path without increasing the size of an electrical equipment and, on the other hand, improves the dissipation of heat generated during the operation of the electrical equipment.

The invention is not limited to the embodiments described previously but extends to any embodiment in accord with its spirit.

In particular, in an alternative, the bottom wall 51 does not comprise an opening. In particular, the bottom wall 51 then forms a solid wall bordered by the side wall 16. The electrical insulation module 5 then has the first leakage path 71.

In particular, the electrical component 101 may then come directly on the bottom wall 51. The electrical insulation module 5 is then devoid of thermal pad 60. The first leakage path 71 may then comprise an inner surface of the bottom wall 51 situated between the electrical component 101 and the side wall 52, when the electrical component 101 is at a distance from the side wall 52. The electrical component 101 may alternatively come against the side wall 52 such that the first leakage path 71 comprises the inner surface of the peripheral wall 52 and the outer surface of the peripheral wall 52 which extends in particular between the second end of the peripheral wall 52 and the support plate 15.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. An electrical insulation module configured to determine at least one leakage path between an electrical component and a casing receiving said electrical component; the electrical insulation module being made of electrically insulating material and comprising:
    a spacer, comprising a bottom wall and a peripheral wall, said spacer being configured to define the at least one leakage path between said electrical component and said casing;
    in which:
        the peripheral wall follows a direction different from that of the bottom wall, an inner angle being formed between the bottom wall and the peripheral wall; and
        the at least one leakage path comprises at least one dimension of a surface corresponding to a portion of the bottom wall and/or a dimension of a surface of a portion of the peripheral wall.

2. The electrical insulation module according to claim 1, wherein said inner angle is comprised between 80 and 110 degrees.

3. The electrical insulation module according to claim 1, wherein said spacer comprises a reception cavity defined by the bottom wall and the peripheral wall and configured to receive at least one portion of the at least one electrical component.

4. The electrical insulation module according to claim 1, wherein the peripheral wall comprises a rim, the at least one leakage path further comprising a dimension of a surface of said rim.

5. The electrical insulation module according to claim 1, further comprising a thermal pad configured to be positioned between said electrical component and said spacer, said thermal pad being configured to evacuate at least a part of the heat generated during the operation of the electrical component.

6. The electrical insulation module according to claim 5, wherein the spacer comprises an opening formed in the bottom wall and configured to enable contact between the thermal pad and a wall of the casing so as to evacuate at least a part of said generated heat.

7. The electrical insulation module according to claim 5, wherein the thermal pad is made of a deformable material.

8. An electrical equipment comprising a casing and at least one electrical component; said casing comprising at least one housing defined by a side wall and a support plate on which the at least one electrical component is mounted;
    wherein the electrical equipment in that it comprises:
    an electrical insulation module according to claim 1.

9. The electrical equipment according to claim 8, wherein the electrical insulation module further comprises a thermal pad configured to be positioned between said electrical component and said spacer, said thermal pad being configured to evacuate at least a part of the heat generated during the operation of the electrical component, wherein, in said electrical equipment, first leakage path extends successively along an upper outer surface of the thermal pad situated between the electrical component and the peripheral wall; and an inner surface of the peripheral wall devoid of thermal pad.

10. The electrical equipment according to claim 8, wherein the electrical insulation module further comprises a thermal pad configured to be positioned between said electrical component and said spacer, said thermal pad being configured to evacuate at least a part of the heat generated during the operation of the electrical component, wherein the spacer comprises an opening formed in the bottom wall and configured to enable contact between the thermal pad and a wall of the casing so as to evacuate at least a part of said generated heat, wherein, in said electrical equipment second leakage path extends successively along an upper outer surface of the thermal pad situated between the electrical component and the peripheral wall; a first contact surface between the thermal pad and said peripheral wall; and a third contact surface between the thermal pad and said bottom wall up to said support plate.

11. The electrical insulation module according to claim 2, wherein said spacer comprises a reception cavity defined by the bottom wall and the peripheral wall and configured to receive at least one portion of the at least one electrical component.

12. The electrical insulation module according to claim 2, wherein the peripheral wall comprises a rim, the at least one leakage path further comprising a dimension of a surface of said rim.

13. The electrical insulation module according to claim 3, wherein the peripheral wall comprises a rim, the at least one leakage path further comprising a dimension of a surface of said rim.

14. The electrical insulation module according to claim 2, further comprising a thermal pad configured to be positioned between said electrical component and said spacer, said thermal pad being configured to evacuate at least a part of the heat generated during the operation of the electrical component.

15. The electrical insulation module according to claim 3, further comprising a thermal pad configured to be positioned between said electrical component and said spacer, said thermal pad being configured to evacuate at least a part of the heat generated during the operation of the electrical component.

16. The electrical insulation module according to claim 4, further comprising a thermal pad configured to be positioned between said electrical component and said spacer, said thermal pad being configured to evacuate at least a part of the heat generated during the operation of the electrical component.

17. The electrical insulation module according to claim 6, wherein the thermal pad is made of a deformable material.

18. The electrical equipment comprising a casing and at least one electrical component; said casing comprising at least one housing defined by a side wall and a support plate on which the at least one electrical component is mounted; the electrical equipment wherein that it comprises:
an electrical insulation module according to claim 2.

19. The electrical equipment comprising a casing and at least one electrical component; said casing comprising at least one housing defined by a side wall and a support plate on which the at least one electrical component is mounted; the electrical equipment wherein that it comprises:
an electrical insulation module according to claim 3.

20. The electrical equipment comprising a casing and at least one electrical component; said casing comprising at least one housing defined by a side wall and a support plate on which the at least one electrical component is mounted; the electrical equipment wherein that it comprises:
an electrical insulation module according to claim 4.

* * * * *